United States Patent
Kim

(10) Patent No.: US 7,911,853 B2
(45) Date of Patent: Mar. 22, 2011

(54) CLOCK PATH CONTROL CIRCUIT AND SEMICONDUCTOR MEMORY DEVICE USING THE SAME

(75) Inventor: Jae-Il Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 80 days.

(21) Appl. No.: 12/345,794

(22) Filed: Dec. 30, 2008

(65) Prior Publication Data
US 2010/0103748 A1   Apr. 29, 2010

(30) Foreign Application Priority Data
Oct. 27, 2008   (KR) .................... 10-2008-0105281

(51) Int. Cl.
*G11C 7/10* (2006.01)
(52) U.S. Cl. ............... 365/189.05; 365/194; 365/191; 365/233.1; 365/233.11
(58) Field of Classification Search ........... 365/189.02, 365/189.05, 233.1, 233.11, 233.12, 191, 365/194
See application file for complete search history.

(56) References Cited

U.S. PATENT DOCUMENTS
7,715,252 B2 * 5/2010 Lee ................... 365/193
2007/0257717 A1 * 11/2007 Yoon .................. 327/153
2008/0137472 A1 * 6/2008 Schnell et al. ........ 365/233.11

FOREIGN PATENT DOCUMENTS
KR         100632626 B1    9/2006

OTHER PUBLICATIONS

Notice of Preliminary Rejection issued from Korean Intellectual Property Office on Mar. 31, 2010.

* cited by examiner

*Primary Examiner* — Huan Hoang
*Assistant Examiner* — Kretelia Graham
(74) *Attorney, Agent, or Firm* — IP & T Group LLP

(57) ABSTRACT

A clock path control circuit includes a clock control signal generating unit configured to generate a clock control signal having an activation period corresponding to an activation period of a data input buffer; and a clock transfer unit configured to provide a clock signal to a write clock path in response to the clock control signal during the activation period of the clock control signal.

15 Claims, 5 Drawing Sheets

CLOCK PATH CONTROL CIRCUIT AND SEMICONDUCTOR MEMORY DEVICE USING THE SAME

CROSS-REFERENCE TO RELATED APPLICATION

The present invention claims priority to Korean patent application number 10-2008-0105281, filed on Oct. 27, 2008, which is incorporated by reference in its entirety.

FIELD OF THE INVENTION

The present invention relates to a semiconductor design technique, and more particularly, to a technique for controlling a write clock path in an integrated circuit and a semiconductor memory device having a plurality of clock paths.

BACKGROUND OF THE INVENTION

In general, a semiconductor memory device includes a plurality of clock paths to transfer a clock signal to internal circuits, and each of the internal circuits uses the clock signal transferred through a corresponding clock path.

FIG. 1 is a block diagram illustrating a conventional semiconductor memory device.

As shown, a semiconductor memory device enables a clock input buffer to buffer a clock signal CLK applied through a pad, and transfers the clock signal to a first clock path CLK PATH1, a second clock path CLK PATH2 and a write clock path WRITE CLK PATH. The clock signal CLK transferred through the first and second clock paths CLK PATH1 and CLK PATH2 is provided to a first internal circuit 130 and a second internal circuit 140, and is used in corresponding internal circuits.

Moreover, the semiconductor memory device has a data input control unit 110 and a data input driving unit 120. The data input control unit 110 compares a data alignment signal ALIGN_S with the clock signal CLK_W transferred through the write clock path WRITE CLK PATH, and generates a data input enable signal DINSTBP. The data input driving unit 120 transfers aligned input data signals DATA_IN<1:N>, which are outputted from a data input buffer, to a data transfer line GLOBAL DAT LINE in response to the data input enable signal DINSTBP.

An operation of the conventional semiconductor memory device mentioned above will be described below.

The data input control unit 110 compares the data alignment signal ALIGN_S with the clock signal CLK_W transferred through the write clock path WRITE CLK PATH, and generates the data input enable signal DINSTBP. The data alignment signal ALIGN_S is enabled when the input data signals DATA_IN<1:N> applied from an external source are buffered by the data input buffer and aligned in parallel.

The data input driving unit 120 transfers the input data signals DATA_IN<1:N>, which are aligned in response to the data input enable signal DINSTBP, to a data transfer line GLOBAL DATA LINE.

As mentioned above, the conventional semiconductor memory device produces a dynamic current consumption of the clock signal because the clock signal CLK_W provided to the data input control unit 110, which generates the data input enable signal DINSTBP, is consecutively toggled.

Since the dynamic current produced by the toggling of the clock signal is increased in proportion to a frequency when the frequency of the clock signal is increased to improve a performance of the semiconductor memory device, it is necessary to reduce a current consumption produced by the clock signal.

SUMMARY OF THE INVENTION

Embodiments of the present invention are directed to providing an integrated circuit and a semiconductor memory device for reducing a current consumption, which is produced by an unnecessary toggling of a clock signal, by controlling a write clock path.

In accordance with an aspect of the present invention, there is provided a clock path control circuit, including a clock control signal generating unit configured to generate a clock control signal having an activation period corresponding to an activation period of a data input buffer; and a clock transfer unit configured to provide a clock signal to a write clock path in response to the clock control signal during the activation period of the clock control signal.

In accordance with another aspect of the present invention, there is provided a semiconductor memory device configured to use a clock path control circuit, including: a clock control signal generating unit configured to delay an inactivation time of a control signal having an activation period corresponding to an activation period of a data input buffer up to a predetermined delay amount, and to generate a clock control signal having an activation period that exceeds the control signal up to the predetermined delay amount; a clock transfer unit configured to provide the clock signal to a write clock path during an activation period of the clock control signal; a data input control unit configured to compare the clock signal transferred to the write clock path with a data alignment signal, and to generate a data input enable signal; and a data input driving unit configured to transfer an aligned input data signal outputted from the data input buffer to a data transfer line in response to the data input enable signal.

In some embodiments of the present invention, a method for controlling a toggling of the clock signal transferred through a write clock path is used in response to a clock control signal having an activation period corresponding to an activation period of a data input buffer.

Accordingly, the clock signal transferred through the write clock path is able to produce the toggling at the activation period of a clock control signal and substantially reduce the current consumption produced by the toggling of the clock signal.

DESCRIPTION OF SPECIFIC EMBODIMENTS

Hereinafter, an internal generation circuit of a semiconductor memory device in accordance with the present invention will be described in detail with reference to the accompanying drawings.

In general, a logic signal has a logic high level or a logic low level in response to a voltage level and is expressed as '1' or '0'. A logic signal is defined and described in that it may additionally have a high impedance level HI-Z. A toggling of a clock signal may also be described as a transition. Both of the terms, toggling of the clock signal and transition, are used to have similar meanings in embodiments of the present invention.

Figure 1:
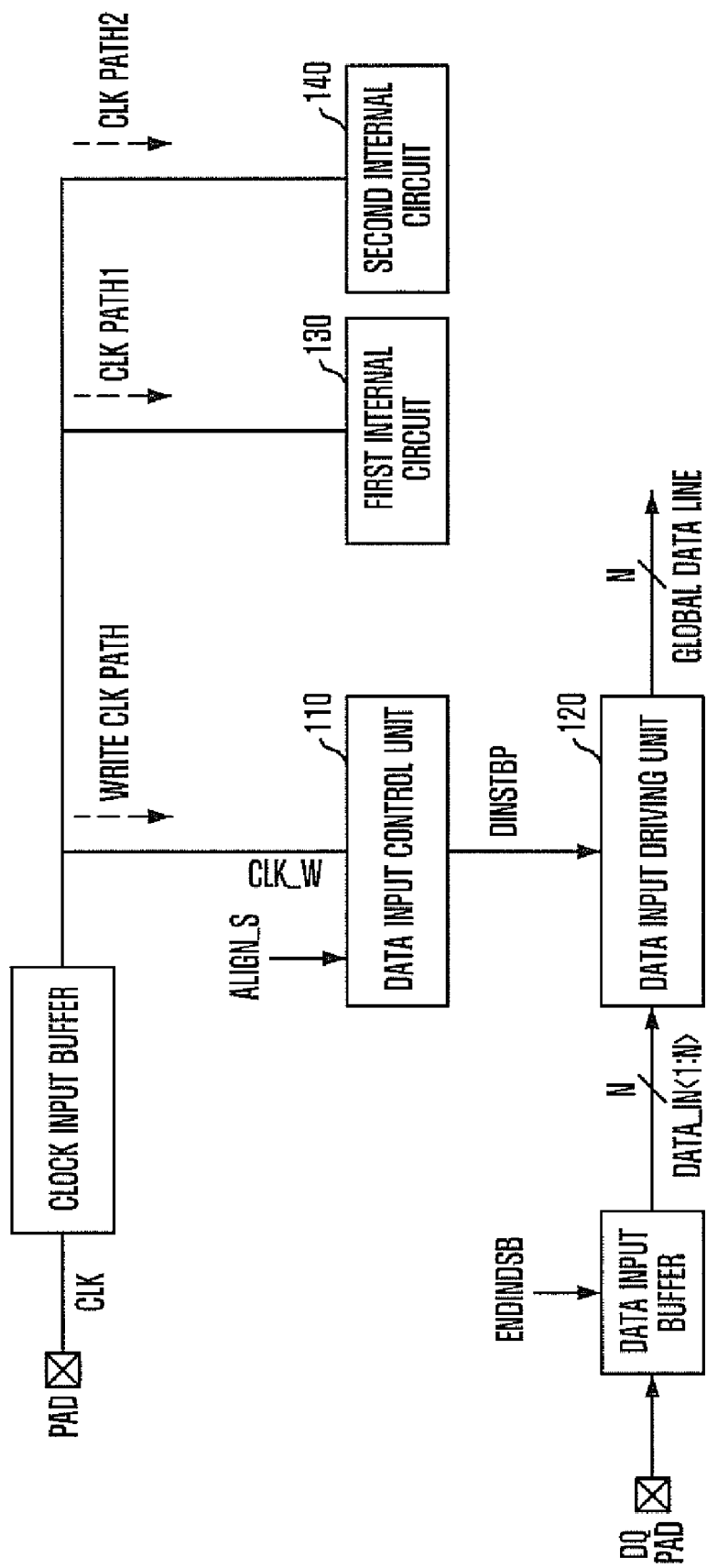
FIG. 1 is a block diagram illuminating a conventional semiconductor memory device.
Figure 2:
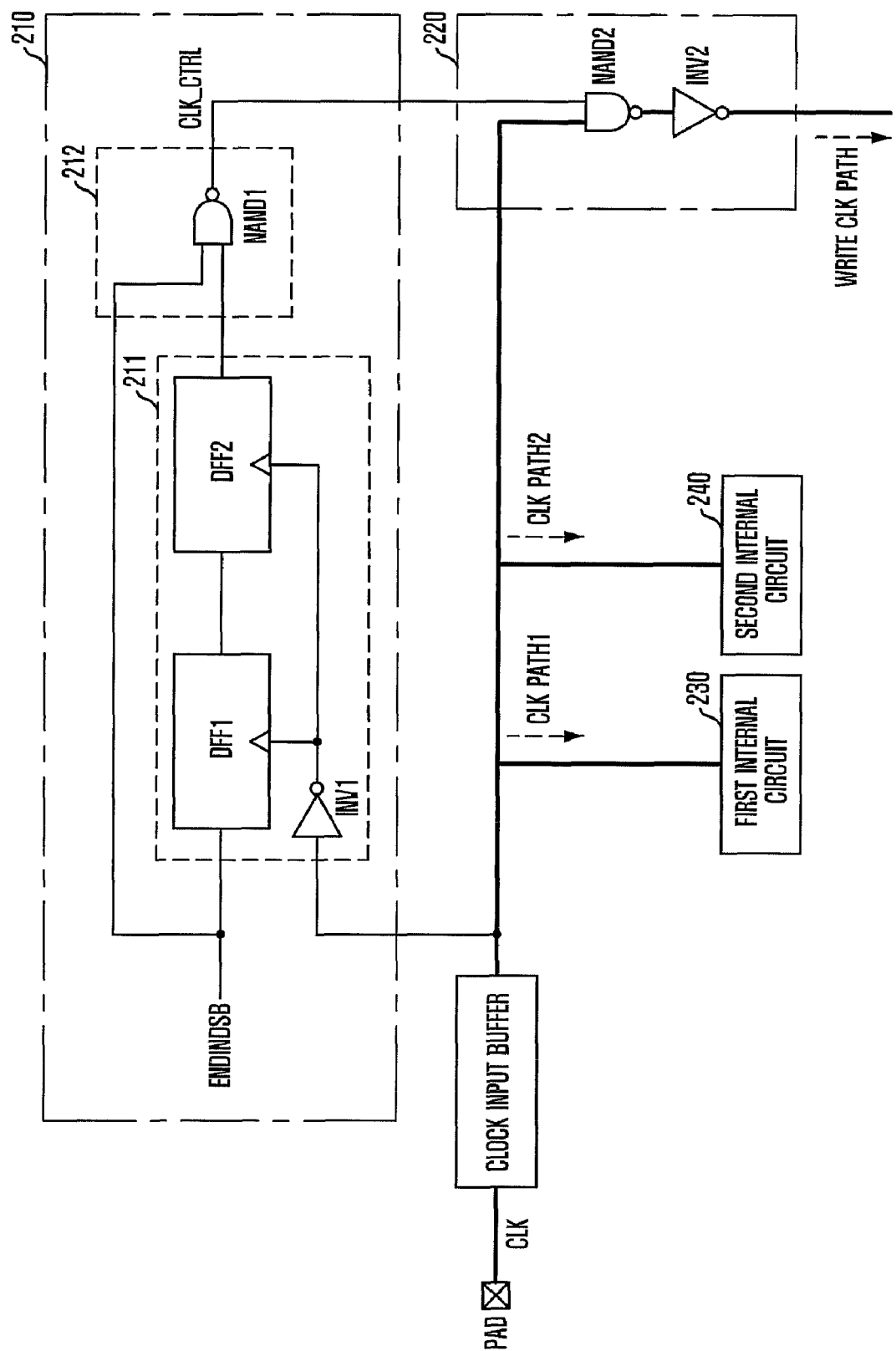
FIG. 2 is a block diagram illustrating an integrated circuit in accordance with an embodiment of the present invention.

FIG. 2 is a block diagram illustrating an integrated circuit in accordance with an embodiment of the present invention.

Referring to FIG. 2, an integrated circuit enables a clock input buffer to buffer a clock signal CLK applied through a pad, and transfers the clock signal CLK to a first clock path CLK PATH1, a second clock path CLK PATH2, and a write clock path WRITE CLK PATH. The clock signal CLK transferred through the first and second clock paths CLK PATH1 and CLK PATH2 is provided to a first internal circuit 230 and a second internal circuit 240, and is used in a corresponding internal circuit. The integrated circuit includes a write clock path control circuit having a clock control signal generating unit 210 and a clock transfer unit 220.

The clock control signal generating unit 210 generates a clock control signal CLK_CTRL period having an activation period corresponding to an activation period of the data input buffer. The clock transfer unit 220 provides the clock signal CLK to the write clock path WRITE CLK PATH during the activation period of the clock control signal CLK_CTRL.

The clock control signal generating unit 210 of the write clock path control circuit receives a data input buffer enable signal ENDINDSB and delays an inactivation time of the data input buffer enable signal ENDINDSB. The clock control signal generating unit 210 generates the clock control signal CLK_CTRL having an activation period that exceeds the data input buffer enable signal ENDINDSB.

A detailed configuration and operation of the write clock path control circuit will be described below.

The clock control signal generating unit 210 has a latching unit 211 for latching the data input buffer enable signal ENDINDSB in response to the clock signal CLK, and a comparison unit 212 for comparing the data input buffer enable signal ENDINDSB with an output signal of the latching unit 211. The latching unit 211 is configured with a plurality of flip-flops DFF1 and DFF2 controlled by a signal which is inversed from the clock signal CLK. The comparison unit 212 is configured with a NAND logic circuit NAND1 which receives the data input buffer enable signal ENDINDSB and the output signal of the latching unit 211. A NAND gate is used as the NAND logic circuit NAND1.

Also, the clock transfer unit 220 is configured with an AND logic circuit which receives the clock control signal CLK_CTRL and the clock signal CLK. A NAND gate NAND2 and an inverter INV2 are used as the AND logic circuit in an embodiment of the present invention.

The latching unit 211 of the clock control signal generating unit 210 delays and outputs the data input buffer enable signal ENDINDSB for a predetermined time by control of the inversed signal of the clock signal CLK. The comparison unit 212 compares the delayed signal with the data input buffer enable signal ENDINDSB and generates the clock control signal CLK_CTRL having an activation period that exceeds the data input buffer enable signal.

Because the clock transfer unit 220 provides the clock signal CLK to the write clock path WRITE CLK PATH when the clock control signal CLK_CTRL is activated, the clock signal of the write clock path WRITE CLK PATH is not toggled when the clock control signal CLK_CTRL is inactivated. That is, the clock signal CLK transferred to the write clock path WRITE CLK PATH performs the toggling at the activation period of the clock control signal CLK_CTRL.

A data input buffer controlled by the data input buffer enable signal ENDINDSB buffers and outputs an input data signal which is sequentially applied through an input/output pad (DQ PAD) during the activation period of the data input buffer enable signal ENDINDSB.

Moreover, since the input data signal outputted from the data input buffer is aligned in parallel and is transferred to an internal location, the clock signal CLK must be provided to the write clock path WRITE CLK PATH until the input data signal is aligned and transferred. Accordingly, the clock control signal CLK_CTRL must be inactivated after the input data signal outputted from the data input buffer is aligned.

Figure 3:
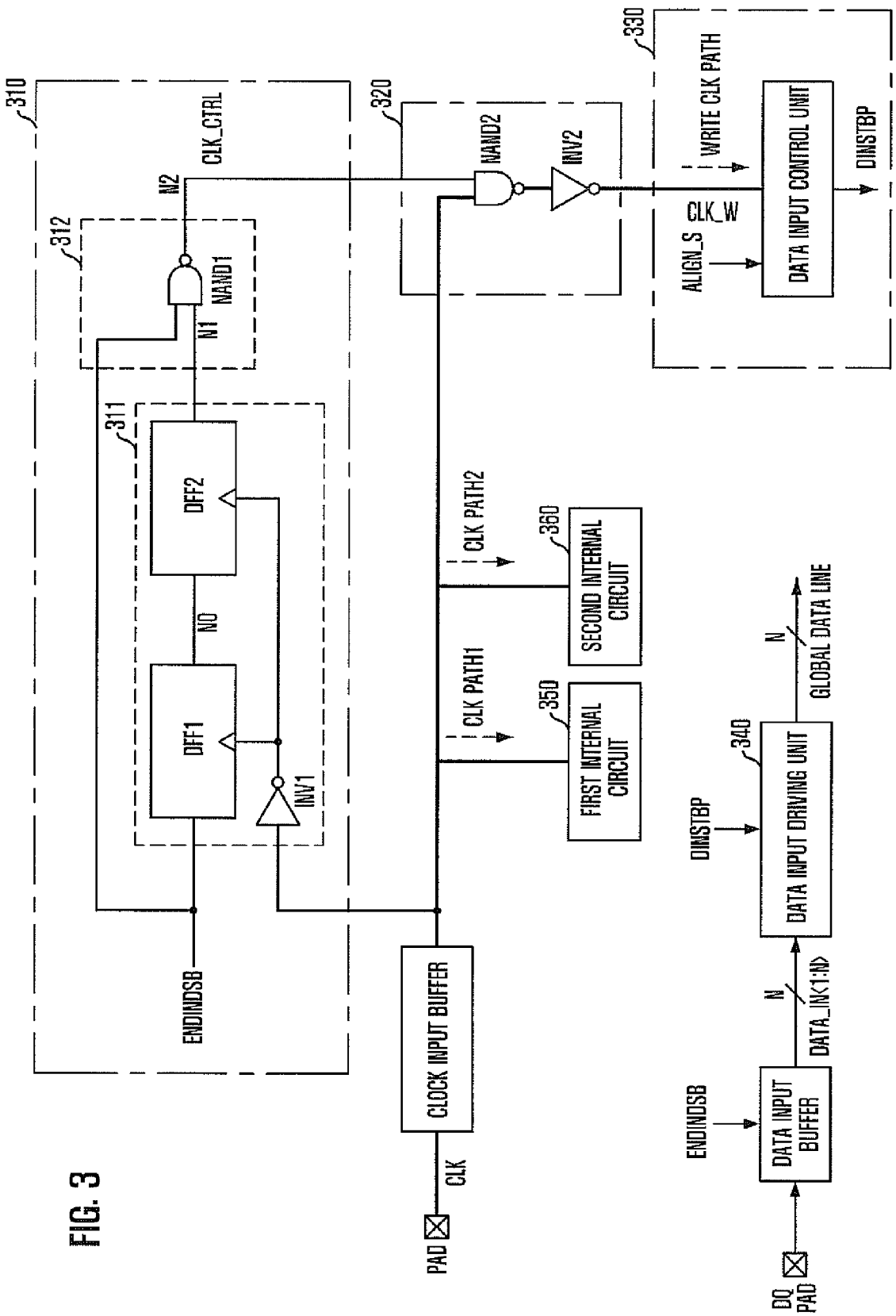
FIG. 3 is a block diagram illustrating a semiconductor memory device in accordance with an embodiment of the present invention.

FIG. 3 is a block diagram illustrating a semiconductor memory device in accordance with an embodiment of the present invention. In FIG. 3, the elements which are identical with the constituent elements shown in FIG. 2 are assigned the same reference numerals, and repeated explanations thereof will be omitted or simplified.

Referring to FIG. 3, the semiconductor memory device enables a clock input buffer to buffer a clock signal CLK applied through a pad PAD and to transfer the clock signal CLK to a first clock path CLK PATH1, a second clock path CLK PATH2, and a write clock path WRITE CLK PATH.

The clock signal CLK transferred through the first and second clock paths CLK PATH1 and CLK PATH2 is provided to a first internal circuit 350 and a second internal circuit 350.

Moreover, the semiconductor memory device includes a clock control signal generating unit 310, a clock transfer unit 320, a data input control unit, and a data input driving unit 340. The clock control signal generating unit 310 delays an inactivation time of a data input buffer enable signal ENDINDSB having an activation period corresponding to an activation period of a data input buffer up to a predetermined delay amount, and generates a clock control signal CLK_CTRL having an activation period that exceeds the data input buffer enable signal ENDINDSB up to the delay amount. The clock transfer unit 320 provides the clock signal CLK to the write clock path WRITE CLK PATH during the activation period of the clock control signal CLK_CTRL. The data input control unit 330 compares a clock signal CLK_W, which is transferred through the write clock path WRITE CLK PATH, with a data alignment signal ALIGN_S, and generates a data input enable signal DINSTBP. The data input driving unit 340 transfers aligned input data signals DATA_IN<1:N> outputted from the data input buffer to a data transfer line GLOBAL DATA LINE in response to the data input enable signal DINSTBP.

A detailed configuration and operation of the semiconductor memory device mentioned above will be described below.

The clock control signal generating unit 310 includes a latching unit 311 for latching the data input buffer enable signal ENDINDSB in response to the clock signal CLK, and a comparison unit 312 for comparing the data input buffer enable signal ENDINDSB with an output signal of the latching unit. The latching unit 311 is configured with a plurality of flip-flops DFF1 and DFF2 controlled by an inversed signal of the clock signal CLK. The comparison unit 312 is configured with a NAND logic circuit NAND1 which receives the output signal of the latching unit 311 and the data input buffer enable signal ENDINDSB. A NAND gate is used as the NAND logic circuit NAND1.

Also, the clock transfer unit 320 is configured with an AND logic circuit which receives the clock control signal CLK_C-

TRL and the clock signal CLK. A NAND gate NAND2 and an inverter INV2 are used as the AND logic circuit in an embodiment of the present invention.

The latching unit 311 of the clock control signal generating unit 310 delays and outputs the data input buffer enable signal ENDINDSB for a predetermined time in response to an inverse signal of the clock signal CLK. The comparison unit 312 compares the output signal of the latching unit 311 with the data input buffer enable signal ENDINDSB, and generates the clock control signal CLK_CTRL having an activation period that exceeds the data input buffer enable signal END-INDSB.

Since the clock transfer unit 320 provides the clock signal CLK to the write clock path WRITE CLK PATH when the clock control signal CKL_CTRL is activated, the clock signal CLK_W of the write clock path WRITE CLK PATH is not toggled. That is, the clock signal CLK provided to the write clock path WRITE CLK PATH is toggled in an activation period of the clock control signal CLK_CTRL.

The data input control unit 330 compares the clock signal CLK_W provided through the write clock path WRITE CLK PATH with a data alignment signal ALIGN_S and generates the data input enable signal DINSTBP. The data input driving unit 340 transfers the aligned input data signals DATA_IN<1:N> outputted from the data input buffer in response to the data input enable signal DINSTBP. The data alignment signal ALIGN_S is activated when the input data signals DATA_IN<1:N> applied from an external source are buffered by the input buffer and are aligned in parallel.

The data input buffer controlled by the data input buffer enable signal ENDINDSB buffers and outputs the input data signal which is sequentially applied through an input/output pad DQ during the activation period of the input buffer enable signal ENDINDSB. Since the input data signal outputted from the data input buffer is aligned in parallel, the clock signal CLK_W must be provided to the write clock path WRITE CLK PATH until the input data signal is aligned and transmitted. Accordingly, the clock control signal CLK_CTRL is inactivated after the input data signal outputted from the data input buffer is aligned.

Figure 4:
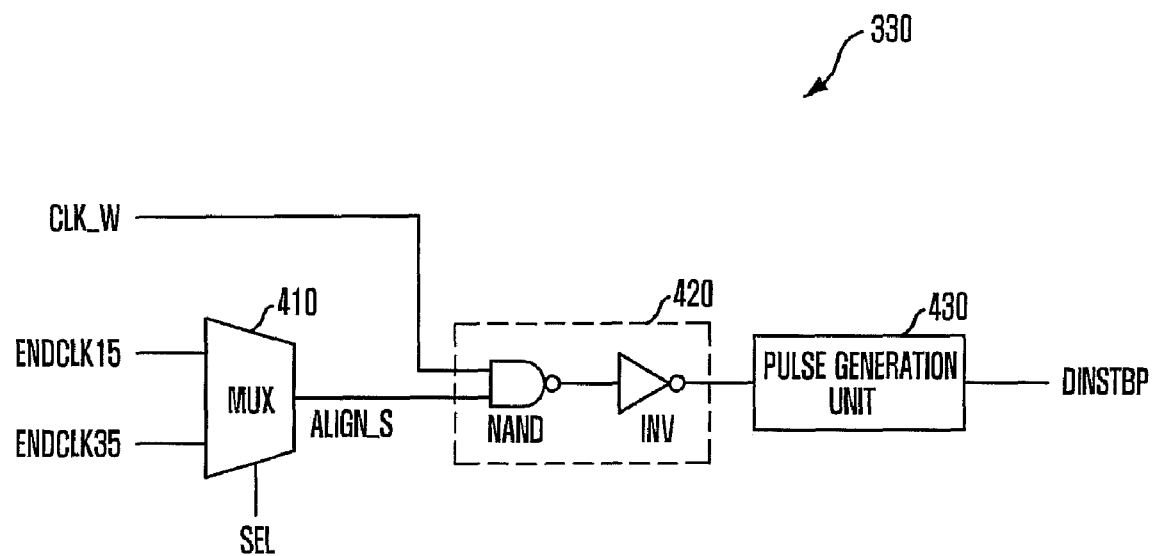
FIG. 4 is a block diagram illustrating a data input control unit in accordance with an embodiment of the present invention.

FIG. 4 is a block diagram illustrating a data input control unit 330 shown in FIG. 3 in accordance with an embodiment of the present invention.

Referring to FIG. 4, the data input control unit 330 includes an AND logic circuit 420 and a pulse generating unit 430. The AND logic circuit 420 receives the clock signal CLK_W and the data alignment signal ALIGN_S. The pulse generating unit 430 receives an output signal of the AND logic circuit 420, and outputs the data input enable signal DINSTBP which performs a pulsing for a predetermined time. The data input control unit 330 may further include a selection unit 410 which selectively outputs first and second data alignment signals ENDCLK15 and ENDCLK35 in response to a selection signal SEL. A NAND gate and an inverter are used as the AND logic circuit 420 in an embodiment of the present invention. A multiplexer MUX is used as the selection unit 410.

Since the input data signals DATA_IN<1:N> may be aligned at a different time based on a burst length (BL) of the input data signals DATA_IN<1:N>, the first data alignment signal ENDCLK15 and the second data alignment signal ENDCLK35 are selectively outputted through the selection unit 410 in response to the selection signal SEL depending on the burst length (BL).

The data alignment signal ALIGN_S has an activation period of a period TCK based on the clock signal CLK. The pulse generating unit 430 adjusts a pulse width of the activation period and generates the data input enable signal DIN-STBP.

Figure 5:
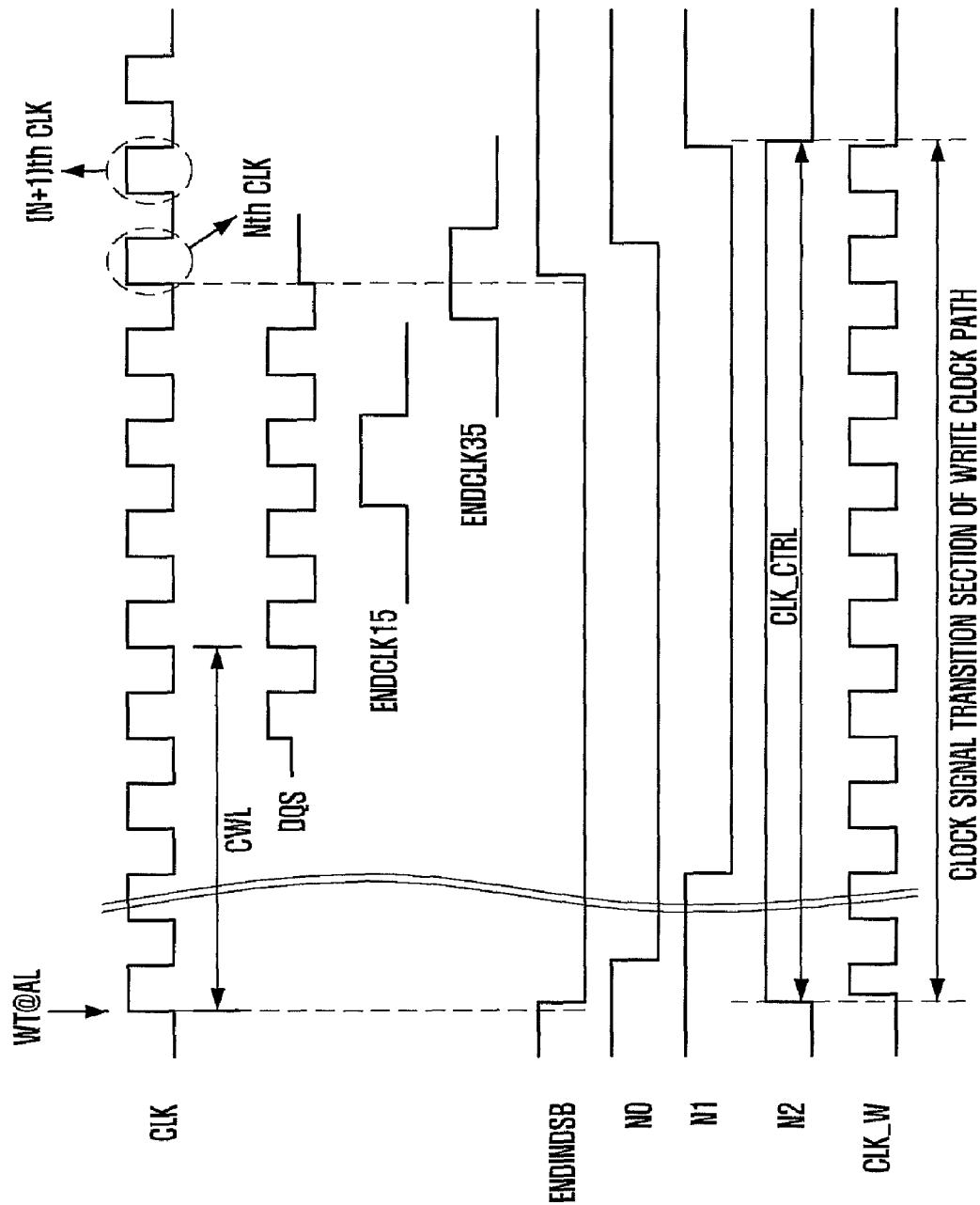
FIG. 5 is a timing diagram illustrating an operation of a semiconductor memory device in accordance with an embodiment of the present invention.

FIG. 5 is a timing diagram illustrating an operation of a semiconductor memory device in accordance with an embodiment of the present invention.

Referring to FIG. 5, an operation of the semiconductor memory device shown in FIG. 3 will be described below.

If a write command WT is applied, the input buffer enable signal ENDINDSB is activated with a logic low level after an additive latency AL, and an input data signal is applied after a column address strobe (CAS) write latency CWL.

The first data alignment signal ENDCLK15 has an activation period of 1TCK which is activated with a logic high level after 1.5TCK from the clock signal CLK when the input data signal is applied. The second data alignment signal END-CLK35 has an activation period of 1TCK which is activated to a logic high level after 3.5TCK from the clock signal CLK when the input data signal is applied.

When the burst length is '4', the input data signal is aligned in parallel after 1.5TCK from the clock signal CLK when the input data signal is applied, and thus the first data alignment signal ENDCLK15 is used. When the burst length is '8', the input data signal is aligned in parallel after 3.5TCK from the clock signal CLK when the input data signal is applied, and thus the second data alignment signal ENDCLK35 is used.

The data input control unit 330 generates the data input enable signal DINSTBP in response to the data alignment signal ALIGN_S and the clock signal CLK_W transferred through the write clock path WRITE CLK PATH. If it is assumed that the burst length is '8', although the clock signal CLK_W of the write clock path WRITE CLK PATH is toggled until 'NTH CLK,' the data input enable signal DIN-STBP is generated and thus the semiconductor memory device performs a normal write operation. That is, after the 'NTH CLK', the clock signal CLK_W of the write clock path WRITE CLK PATH is toggled and produces a dynamic current consumption.

The data input buffer enable signal ENDINDSB is inputted to the latching unit 311 of the clock control signal generating unit 310 and is latched and outputted through the first flip-flop DFF1 and the second flip-flop DFF2 which are controlled by the inversed signal of the clock signal CLK. A signal outputted through an output node NO of the first flip-flop DFF1 and an output node N1 of the second flip-flop DFF2 is delayed for a predetermined time and is outputted.

The comparison unit 312 of the clock control signal generating unit 310 performs a NAND logic operation of the signal outputted through the output node N1 of the second flip-flop and the input buffer enable signal ENDINDSB, and outputs the clock control signal CLK_CTRL to the output node N2 of the comparison unit 312.

The clock transfer unit 320 provides the clock signal CLK to the write clock path WRITE CLK PATH while the clock control signal CLK_CTRL is activated with a logic high level. Thus, the clock signal CLK_W of the write clock path WRITE CLK PATH is toggled when the clock control signal CLK_CTRL is activated, and the clock signal CLK_W of the write clock path WRITE CLK PATH is not toggled when the clock control signal is inactivated. That is, because the clock signal CLK_W of the write clock path WRITE CLK PATH is toggled until '(N+1)TH CLK,' this does not have an influence on a write operation of the semiconductor memory device and reduces a current consumption produced by the toggling of the clock signal CLK.

While the present invention has been described with respect to the specific embodiments, it will be apparent to those skilled in the art that various changes and modifications may be made without departing from the spirit and scope of the invention as defined in following claims.

For example, an active high or an active logic low configuration for indicating a signal enable state may be varied according to embodiments of the present invention. Moreover, a configuration of a logic gate may be varied to implement the same function. That is, a NAND logic circuit, a NOR logic circuit may be configured with a combination of a NAND gate, a NOR gate and an inverter.

What is claimed is:

1. A clock path control circuit, comprising:
    a clock control signal generating unit configured to generate a clock control signal having an activation period corresponding to an activation period of a data input buffer; and
    a clock transfer unit configured to provide a clock signal to a write clock path in response to the clock control signal,
    wherein the clock control signal generating unit is configured to receive a data input buffer enable signal, to delay an inactivation time of the data input buffer enable signal, and to generate the clock control signal having the activation period that is extended more than the data input buffer enable signal.

2. The clock path control circuit of claim 1, wherein the clock control signal is inactivated after an input data signal outputted from the data input buffer is aligned.

3. The clock path control circuit of claim 1, wherein the clock control signal generating unit includes:
    a latching unit configured to latch the data input buffer enable signal in response to the clock signal; and
    a comparison unit configured to compare an output signal of the latching unit with the data input buffer enable signal.

4. The clock path control circuit of claim 3, wherein the latching unit has at least one flip-flop which is controlled by the clock signal.

5. The clock path control circuit of claim 3, wherein the comparison unit has a NAND logic circuit which receives the data input buffer enable signal and the output signal of the latching unit.

6. The clock path control circuit of claim 1, wherein the clock transfer unit has an AND logic circuit which receives the clock control signal and the clock signal.

7. A semiconductor memory device configured to use a clock path control circuit, comprising:
    a clock control signal generating unit configured to delay an inactivation time of a control signal having an activation period corresponding to an activation period of a data input buffer, and to generate a clock control signal;
    a clock transfer unit configured to provide a clock signal to a write clock path during an activation period of the clock control signal;
    a data input control unit configured to compare the clock signal transferred to the write clock path with a data alignment signal, and to generate a data input enable signal; and
    a data input driving unit configured to transfer an input data signal aligned and outputted from the data input buffer to a data transfer line in response to the data input enable signal.

8. The semiconductor memory device claim 7, wherein the data input enable signal is inactivated after the input data signal outputted from the data input buffer is aligned.

9. The semiconductor memory device of claim 7, wherein the clock control signal generating unit includes:
    a latching unit configured to latch the control signal in response to the clock signal; and
    a comparison unit configured to compare an output signal of the latching unit with the control signal.

10. The semiconductor memory device of claim 9, wherein the latching unit has at least one flip-flop which is controlled by the clock signal.

11. The semiconductor memory device of claim 9, wherein the comparison unit has a NAND logic circuit which receives the control signal and the output signal of the latching unit.

12. The semiconductor memory device of claim 7, wherein the clock transfer unit has an AND logic circuit which receives the clock control signal and the clock signal.

13. The semiconductor memory device of claim 7, wherein the data input control unit further includes a selection unit configured to selectively output a plurality of data alignment signals in response to a selection signal.

14. The semiconductor memory device of claim 7, wherein the data input control unit includes:
    an AND logic circuit configured to receive the clock signal and the data alignment signal; and
    a pulse generating unit configured to output the data input enable signal which pulses for a period of time.

15. The semiconductor memory device of claim 14, wherein the data input control unit further includes a selection unit configured to selectively output a plurality of data alignment signals in response to a selection signal.

* * * * *